United States Patent
Chen et al.

[11] Patent Number: 6,015,755
[45] Date of Patent: Jan. 18, 2000

[54] METHOD OF FABRICATING A TRENCH ISOLATION STRUCTURE USING A REVERSE MASK

[75] Inventors: Coming Chen, Taoyuan Hsien; Juan-Yuan Wu, Hsien; Water Lur, Taipei, all of Taiwan

[73] Assignee: United Microelectronics Corp., Hsinchu, Taiwan

[21] Appl. No.: 09/162,576

[22] Filed: Sep. 29, 1998

[30] Foreign Application Priority Data

May 11, 1998 [TW] Taiwan ................................. 87107201

[51] Int. Cl.$^7$ ..................................................... H01L 21/00
[52] U.S. Cl. .............................. 438/692; 216/38; 438/743
[58] Field of Search ..................................... 438/691, 692, 438/719, 693, 723, 756, 743; 216/38, 67, 88, 89; 156/345 LP

[56] References Cited

U.S. PATENT DOCUMENTS 5,494,857  2/1996  Cooperman et al. ............... 438/692 X Primary Examiner—William Powell
Attorney, Agent, or Firm—Hickman Stephens & Coleman, LLP

[57] ABSTRACT

A method for fabricating trench isolation structures using the reverse mask is described. The method of using a reverse mask to fabricate trench isolation structures includes providing a semiconductor substrate having a first trench and a second trench in the substrate. The first trench has a width smaller than a fixed value, while the second trench has a width larger than the fixed value, the fixed value being, for example, about 0.7 $\mu$m. Thereafter, a conformal insulating layer is formed over the first trench and the second trench. Next, a reverse mask layer is formed over the conformal insulating layer, and then the reverse mask layer is patterned. The reverse mask layer is patterned selectively. For example, only the region directly above the second trench is covered by the reverse mask. The region directly above the first trench is exposed. Subsequently, using the patterned reverse mask layer as a mask, a portion of the conformal insulating layer is etched away forming a residual conformal insulating layer underneath the reverse mask layer. Thereafter, the reverse mask layer is removed exposing protruding insulating structures. Finally, the regions of the conformal insulating layer protruding above the semiconductor substrate are polished.

20 Claims, 4 Drawing Sheets

METHOD OF FABRICATING A TRENCH ISOLATION STRUCTURE USING A REVERSE MASK

CROSS-REFERENCE TO RELATED APPLICATION

This application claims the priority benefit of Taiwan application serial no. 87107201, filed May 11, 1998, the full disclosure of which is incorporated herein by reference.

BACKGROUND OF THE INVENTION

1. Field of Invention

The present invention relates to a method of fabricating a trench isolation structure using a reverse mask. More particularly, the present invention relates to a method of forming a reverse mask over a conformal oxide layer in order to fabricate a trench isolation structure. The method is capable of fabricating devices having a line width smaller than about 0.25 $\mu$m and enhancing the degree of uniformity of chemical-mechanical polished (CMP) layer.

2. Description of Related Art

The purpose of using a conventional reverse mask is to reduce the dishing effect due to chemical-mechanical polishing (CMP) so that a uniformly polished layer is obtained.

FIGS. 1A through 1D are cross-sectional views showing the progression of manufacturing steps taken to fabricate a trench isolation structure using a reverse mask according to a conventional method. First, as shown in FIG. 1A, a semiconductor substrate 10 is provided. Next, a thin insulating layer 11 is formed over the substrate 10, and then a first trench 13, a second trench 15 and a third trench 17 are formed in the substrate 10. Width W2 of the second trench 15 and width W3 of the third trench 17 are both greater than width W1 of the first trench 13. Thereafter, a conformal insulating layer 12 is formed over the thin insulating layer 11, the first trench 13, the second trench 15 and the third trench 17. In FIG. 1A, recess cavities 14 and 16 can be seen above the conformal insulating layer 12 above the second trench 15 and the third trench 17, respectively.

Next, as shown in FIG. 1B, a reverse mask layer 18 is formed above the conformal insulating layer 12, and then the reverse mask layer 18 is patterned. This patterned reverse mask layer 18 covers all the trench structures including the first trench 13, the second trench 15 and the third trench 17.

Next, as shown in FIG. 1C, using the reverse mask layer 18 as a mask, the conformal insulating layer 12 is etched to form a patterned conformal insulating layer 12 underneath the reverse mask layer 18. Thereafter, the reverse mask layer 18 is removed forming a plurality of protruded insulating structures, for example, 12a, 12b and 12c.

Finally, as shown in FIG. 1D, a polishing operation, preferably a chemical-mechanical polishing, is carried out to polish the protruding insulating structures such as 12a, 12b and 12c until the semiconductor substrate 10 is exposed. Hence, trench isolation structures such as 13a, 15a and 17a are formed.

Although the aforementioned method of using a reverse mask to fabricate trench isolation structures is capable of removing defects due to the dishing effect, design rules for fabricating devices having line width smaller than 0.25 $\mu$m are written having narrow limits. With little design tolerance, fabrication of a photomask must be controlled precisely, otherwise photo-misalignment can easily occur.

In light of the foregoing, there is a need to improve the method of using reverse masks to fabricate trench isolation structures.

SUMMARY OF THE INVENTION

Accordingly, the objective of the present invention is to provide an improved reverse mask so that when the reverse mask is formed over a conformal insulating layer in the fabrication of trench isolation structures, not only are the design rules for forming a line with a line width smaller than 0.25 $\mu$m satisfied, but the invention is also capable of enhancing the degree of uniformity after a chemical-mechanical polishing operation.

To achieve these and other advantages and in accordance with the purpose of the invention, as embodied and broadly described herein, the invention provides a method of forming a reverse mask over a conformal insulating layer. The method comprises the steps of first providing a semiconductor substrate, and then forming a first trench and a second trench in the substrate. The first trench and the second trench are formed such that the second trench has a width greater than the first trench. Moreover, the first trench has a width smaller than about 0.7 $\mu$m, while the second trench has a width larger than about 0.7 $\mu$m.

Thereafter, a conformal insulating layer is formed over the first trench, the second trench and the substrate. Since the second trench is wider than the first trench, a recess cavity is formed above the conformal insulating layer in a location that corresponds to the second trench while none is formed above the first trench. The recess cavity has a depth of about 0.1 $\mu$m. Next, a reverse mask layer is formed over the conformal insulating layer, and then the reverse mask layer is patterned. The reverse mask layer is patterned selectively such that only the region directly above the second trench is covered by the reverse mask. The region directly above the first trench is exposed. Subsequently, using the patterned reverse mask layer as a mask, a portion of the conformal insulating layer is etched away forming a residual conformal insulating layer underneath the reverse mask layer. Etching can be conducted, for example, by using an anisotropic dry etching method for a pre-determined period. Thereafter, the reverse mask layer is removed forming protruding insulating structures. Finally, the protruding insulating structures are polished using a chemical-mechanical polishing machine until the semiconductor substrate is exposed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
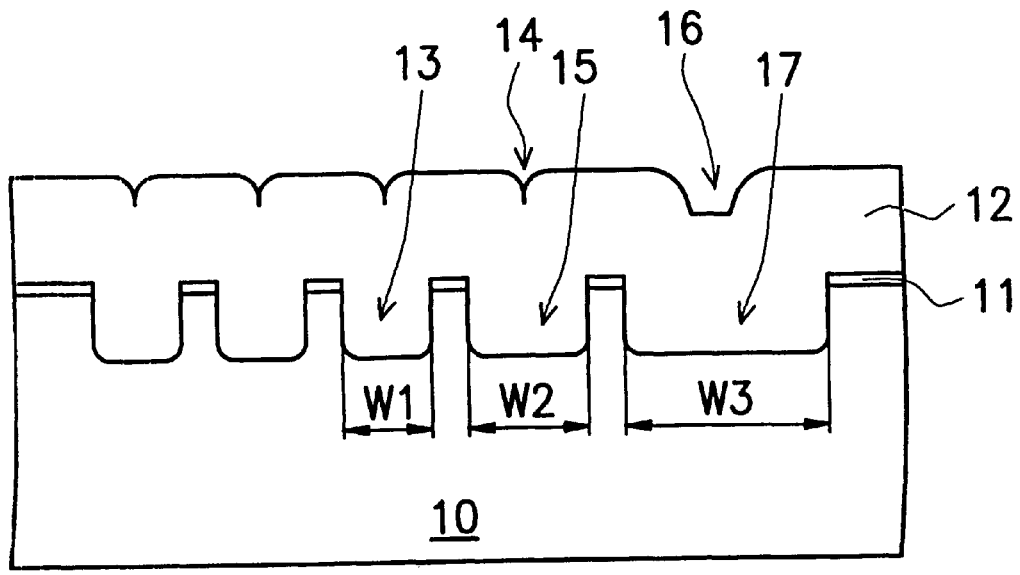
FIGS. 1A through 1D are cross-sectional views showing the progression of manufacturing steps taken to fabricate a trench isolation structure using a reverse mask according to a conventional method.
Figure 1B:
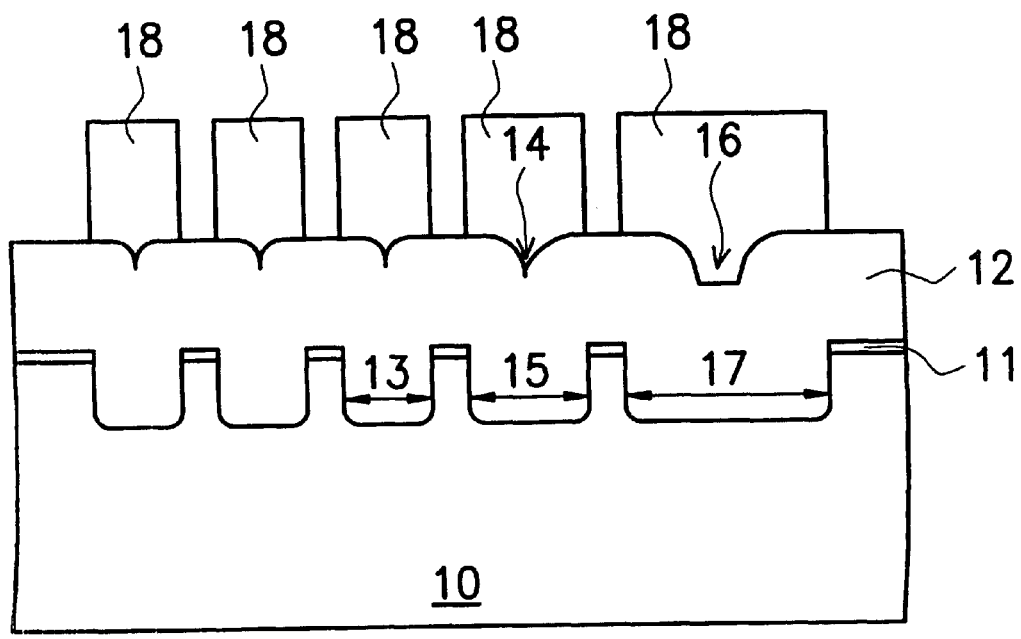
Figure 1C:
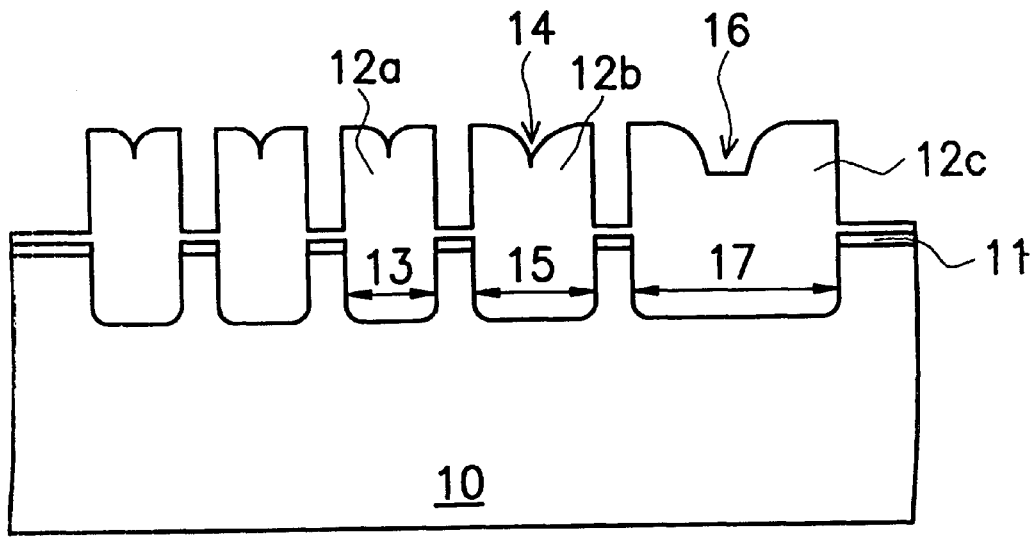
Figure 1D:
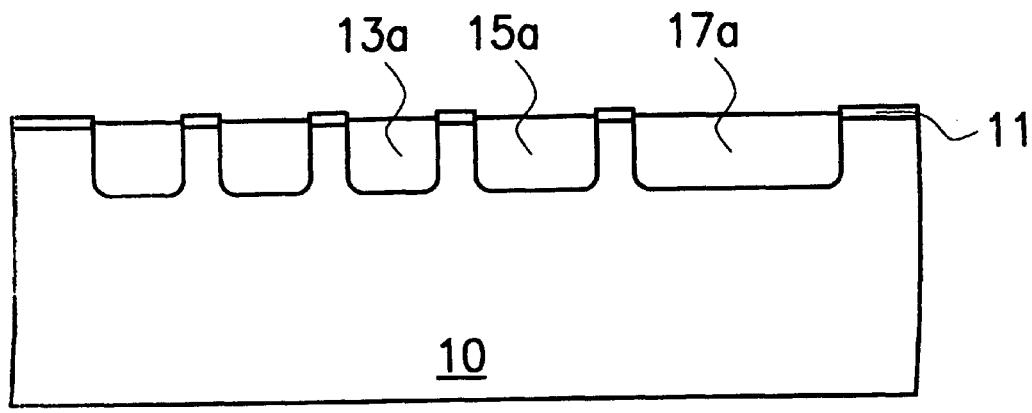

Reference will now be made in detail to the present preferred embodiments of the invention, examples of which are illustrated in the accompanying drawings. Wherever possible, the same reference numbers are used in the drawings and the description to refer to the same or like parts.

This invention provides a reverse mask structure such that when the reverse mask layer is patterned, the reverse mask layer is retained only in some regions according to some pre-defined selection criteria. The reverse mask layer selectively covers certain trench regions while abstaining from some other trench regions. For example, the selection criteria is to form a reverse mask layer only over those trenches having a width greater than about 0.7 $\mu$m, while all the trenches having a width smaller than 0.7 $\mu$m are exposed. Therefore, using the reverse mask to fabricate trench isolation structures, the design rules for forming line width smaller than 0.25 $\mu$m can be satisfied and hence photo-misalignment problems can be prevented. In addition, the method is capable of enhancing the degree of uniformity after a chemical-mechanical polishing operation is performed.

FIGS. 2A through 2D are cross-sectional views showing the progression of manufacturing steps taken to fabricate a trench isolation structure using a reverse mask according to one preferred embodiment of this invention.

Figure 2A:
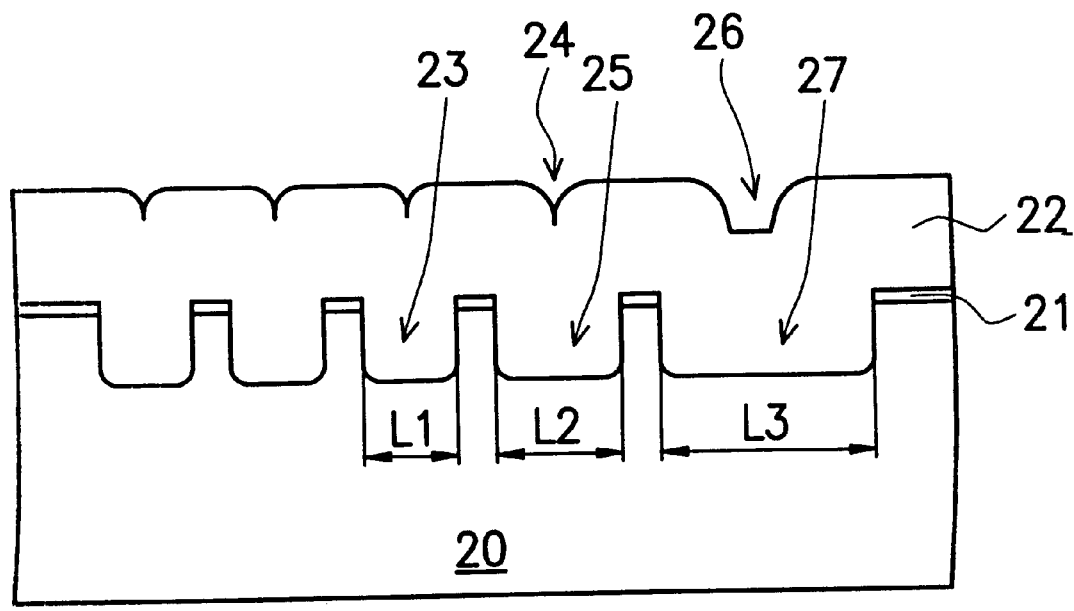
FIGS. 2A through 2D are cross-sectional views showing the progression of manufacturing steps taken to fabricate a trench isolation structure using a reverse mask according to one preferred embodiment of this invention.

First, as shown in FIG. 2A, a semiconductor substrate 20 is provided, and then a thin insulating layer 21, for example, a silicon nitride layer, is formed over the substrate 20. Next, a first trench 23, a second trench 25 and a third trench 27 are formed in the substrate 20. Width L3 of the third trench 27 is greater than width L2 of the second trench 25, and width L2 of the second trench is in turn greater than width L1 of the first trench 23. For example, the first trench 23 has a width L1 smaller than 0.7 $\mu$m, and the second trench 25 and the third trench 25 both have widths L2 and L3 greater than or equal to 0.7 $\mu$m. Widths of the trenches is better summarized in the following inequalities:

$$L1 \leq 0.7(\mu m), L2 \geq 0.7(\mu m), L3 \geq 0.7(\mu m) \tag{1}$$

Next, a conformal insulating layer 22 is formed over the first trench 23, the second trench 25 and the third trench 27. Recess cavities 24 and 26 are formed on the surface of the conformal insulating layer 22 above the second trench 25 and the third trench 27, respectively. Since the width L3 of the third trench 27 is greater than the width L2 of the second trench 25, the depth of the recess cavity 26 will be greater than that of the recess cavity 24. However, the depth of both recess cavities 24 and 26 will be greater than about 0.1 $\mu$m. For those trenches having widths smaller than a fixed value (for example, about 0.7 $\mu$m) such as the first trench 23, recess cavities are so small that the top surface of the conformal insulating layer 22 can be regarded as flat.

Figure 2B:
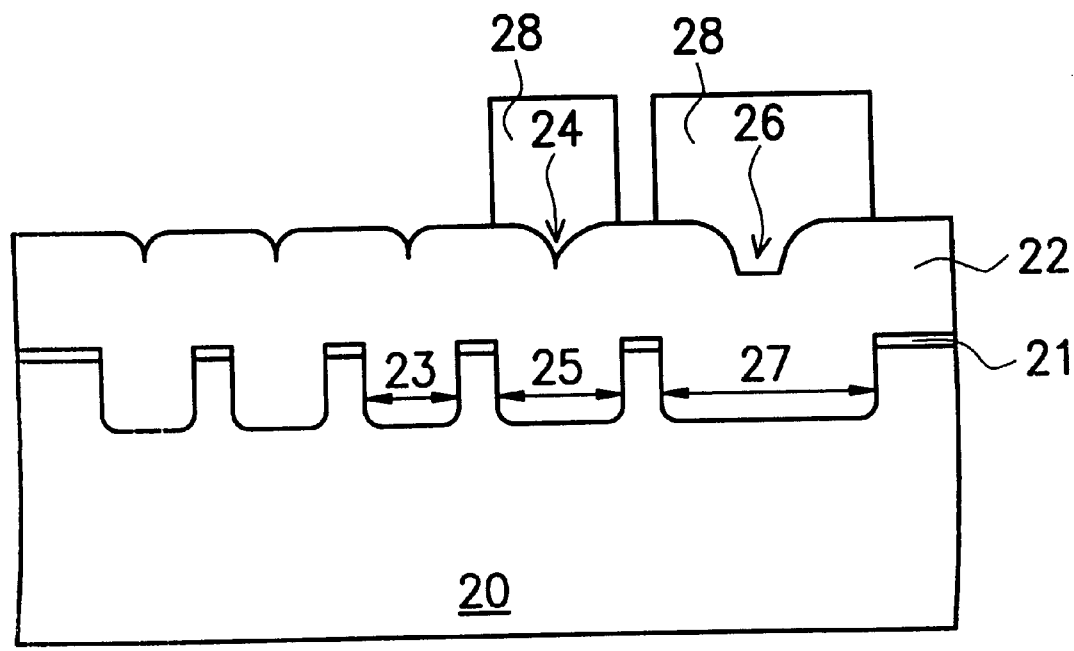

Next, as shown in FIG. 2B, a reverse mask layer 28 is formed over the conformal insulating layer 22. Thereafter, the reverse mask layer 28 is patterned so that the reversed mask layer 28 is selectively formed in certain regions above the conformal insulating layer 22. For example, the reverse mask layer 28 is formed over the recess cavities 24 and 26 while other portions of the conformal insulating layer 22 are exposed. This selective deposition of the reverse mask layer 28 on the conformal insulating layer 22 is one of the particularities of this invention. Using the criteria embodied in inequality relation (1), the reverse mask layer 28 is selectively formed over some regions of the conformal insulating layer 22. For example, the reverse mask layer 28 is formed only over the conformal insulating layer 22 in regions above trenches having a width greater than a definite value (for example, 0.7 $\mu$m) such as trenches 25 or 27. On the other hand, no reverse mask layer 28 is formed over conformal insulating layer 22 in regions above trenches having a width smaller than the defined value (for example, 0.7 $\mu$m). This is because recess cavities are very small above these regions, and there is no need to go through patterning with a reverse mask layer. In other words, these recess cavities can be removed in subsequent processing operations. Using this arrangement, design rules for fabricating devices having a line width smaller than 0.25 $\mu$m can be satisfied, thereby eliminating photomask misalignment problems.

Figure 2C:
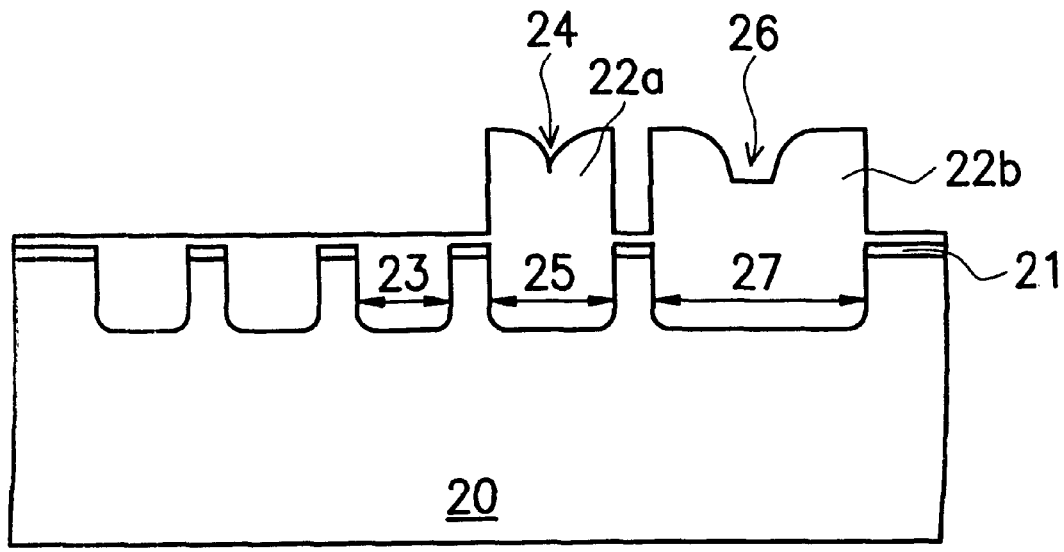

Next, as shown in FIG. 2C, using the reverse mask layer 28 as a mask, the conformal insulating layer 22 is etched to form a patterned conformal insulating layer 22, underneath the reverse mask layer 28. Thereafter, the reverse mask layer 28 is removed forming a plurality of protruding insulating structures, for example, 22a and 22b. The conformal insulating layer 22 can be etched using an anisotropic dry etching method for a fixed period. Length of etching can be used to control the depth of etch such that the etching stops just before the semiconductor substrate 20 is exposed.

Figure 2D:
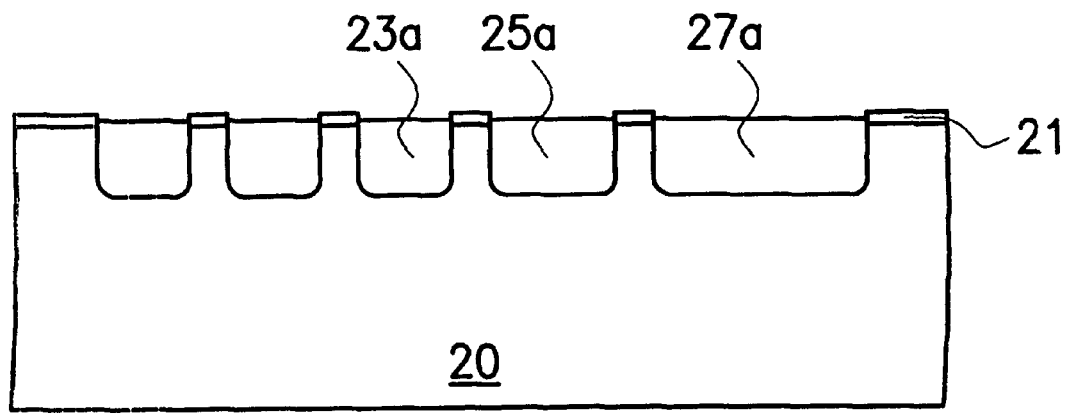

Finally, as shown in FIG. 2D, a polishing operation, preferably a chemical-mechanical polishing (CMP) or an etching back operation is carried out to remove the protruding insulating structures such as 22a, 22b, and exposing the thin insulating layer 21. Hence, trench isolation structures including 23a, 25a and 27a are formed.

In summary, the method of using a reverse mask layer to fabricate trench isolation structures has multiple advantages, including:

1. The reverse mask layer of this invention is selectively formed over some trench regions only. Therefore, this invention can be satisfied applied to the design rules for fabricating devices having line width smaller than 0.25 $\mu$m, and hence is able to prevent photomask misalignment problems.

2. The reverse mask layer of this invention is capable of enhancing the degree of uniformity after a chemical-mechanical polishing operation is performed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a trench isolation structure using a reverse mask, comprising the steps of:

providing a semiconductor substrate;

forming a first trench and a second trench in the substrate, wherein the width of the second trench is greater than the first trench, and furthermore the width of the first trench is smaller than a fixed value while the width of the second trench is greater than the fixed value;

forming a conformal insulating layer over the first trench and the second trench, wherein a recess cavity is formed on the surface of the conformal insulating layer above the second trench;

forming a reverse mask layer over the conformal insulating layer;

patterning the reverse mask layer so that it is selectively formed over specific regions of the conformal insulating layer, including the regions having a recess cavity but exposing other regions of the conformal insulating layer;

etching the conformal insulating layer using the patterned reverse mask layer as a mask to form a patterned conformal insulating layer underneath the reverse mask layer;

removing the reverse mask layer to expose protruding insulating structures; and polishing the protruding insulating structures to expose the semiconductor substrate.

2. The method of claim 1, wherein the first trench has a width smaller than about 0.7 μm and the second trench has a width greater than about 0.7 μm.

3. The method of claim 1, wherein the fixed width has a value of about 0.7 μm.

4. The method of claim 3, wherein the recess cavity has a depth of about 0.1 μm.

5. The method of claim 1, wherein the step of forming the conformal insulating layer includes a chemical vapor deposition method.

6. The method of claim 1, wherein the conformal insulating layer has a thickness of about 7000 Å.

7. The method of claim 1, wherein the step of forming the conformal insulating layer includes depositing silicon oxide.

8. The method of claim 1, wherein the step of forming the first trench and second trench in the substrate further includes forming a third trench in the substrate whose width is greater than the second trench, and that the reverse mask layer also covers the portion of conformal insulating layer above the third trench.

9. The method of claim 1, wherein the step of forming the first trench and second trench in the substrate further includes forming a fourth trench in the substrate whose width is smaller than the first trench, and that the reverse mask layer does not cover the portion of conformal insulating layer above the fourth trench.

10. The method of claim 1, wherein the step of etching the conformal insulating layer includes using an anisotropic dry etching method to etch the conformal insulating layer for a fixed period.

11. The method of claim 1, wherein the step of polishing the protruding insulating structures includes a chemical-mechanical polishing method.

12. The method of claim 1, wherein the step of polishing the protruding insulating structures includes an etching back method.

13. A method of fabricating a reverse mask, comprising the steps of:

providing a semiconductor substrate;

forming a first trench and a second trench in the substrate, wherein width of the second trench is greater than the first trench, and furthermore the width of the first trench is smaller than about 0.7 μm while the width of the second trench is greater than about 0.7 μm;

forming a conformal insulating layer over the first trench and the second trench, wherein there is a recess cavity on the surface of the conformal insulating layer above the second trench, and that the depth of the recess cavity is greater than about 0.1 μm; and patterning the reverse mask layer so that it is selectively formed over specific regions of the conformal insulating layer including the regions having a recess cavity but exposing other regions of the conformal insulating layer.

14. The method of claim 13, wherein after the step of forming the reverse mask layer over the conformal insulating layer, further includes:

etching the conformal insulating layer using the patterned reverse mask layer as a mask to form a patterned conformal insulating layer underneath the reverse mask layer;

removing the reverse mask layer to expose protruding insulating structures; and polishing the protruding insulating structures to expose the semiconductor substrate.

15. The method of claim 13, wherein the conformal insulating layer has a thickness of about 7000 Å.

16. The method of claim 13, wherein the step of forming the conformal insulating layer includes a chemical vapor deposition method.

17. The method of claim 13, wherein the step of forming the conformal insulating layer includes depositing silicon oxide.

18. The method of claim 13, wherein the step of forming the first trench and second trench in the substrate further includes forming a third trench in the substrate whose width is greater than about 0.7 μm, and that the reverse mask layer also covers the portion of conformal insulating layer above the third trench.

19. The method of claim 13, wherein the step of forming the first trench and second trench in the substrate further includes forming a fourth trench in the substrate whose width is smaller than about 0.7 μm, and that the reverse mask layer does not cover the portion of conformal insulating layer above the fourth trench.

20. The method of claim 13, wherein the step of etching the conformal insulating layer includes using an anisotropic dry etching method to etch the conformal insulating layer for a fixed period.

* * * * *